(12) United States Patent
Ishimatsu et al.

(10) Patent No.: US 8,158,887 B2
(45) Date of Patent: Apr. 17, 2012

(54) ADHESIVE FILM, CONNECTING METHOD, AND JOINED STRUCTURE

(75) Inventors: Tomoyuki Ishimatsu, Kanuma (JP); Hiroki Ozeki, Kanuma (JP)

(73) Assignees: Sony Corporation, Minato-Ku, Tokyo (JP); Sony Chemical & Information Device Corporation, Shinagawa-Ku, Tokyo (JP)

( * ) Notice: Subject to any disclaimer, the term of this patent is extended or adjusted under 35 U.S.C. 154(b) by 270 days.

(21) Appl. No.: 12/689,308

(22) Filed: Jan. 19, 2010

(65) Prior Publication Data

US 2010/0116533 A1 May 13, 2010

Related U.S. Application Data

(63) Continuation of application No. PCT/JP2008/061521, filed on Jun. 25, 2008.

(30) Foreign Application Priority Data

Jul. 26, 2007 (JP) .............................. 2007-194702

(51) Int. Cl.
*H05K 1/02* (2006.01)
*B32B 7/12* (2006.01)
*B32B 15/04* (2006.01)

(52) U.S. Cl. ..................... 174/259; 428/214; 428/355 R

(58) Field of Classification Search ................ 428/214, 428/355 R; 174/259
See application file for complete search history.

(56) References Cited

U.S. PATENT DOCUMENTS 6,465,084 B1 * 10/2002 Curcio et al. ................ 428/209
6,514,433 B1    2/2003  Takeichi et al.
8,043,709 B2 * 10/2011 Arifuku et al. ................ 428/450
2003/0141014 A1  7/2003  Satoyuki et al.
2007/0054114 A1  3/2007  Kumakura

FOREIGN PATENT DOCUMENTS

JP        7-230840 A      8/1995
(Continued)

OTHER PUBLICATIONS

International Search Report of Application No. PCT/JP2008/061521 dated Jul. 29, 2008.
Non-English version of the Written Opinion of the International Searching Authority of Application No. PCT/JP2008/061521 dated Jul. 14, 2008.

(Continued)

*Primary Examiner* — Jeremy Norris
(74) *Attorney, Agent, or Firm* — Buchanan Ingersoll & Rooney PC

(57) ABSTRACT

An adhesive film including a first adhesive layer containing a first main resin component and dispersed conductive particles, and a second adhesive layer containing a second main resin component and adhering to the first adhesive layer, each of the adhesive layers containing a secondary resin component, wherein the first main resin component has a glass transition temperature higher than that of the secondary resin component, and the second main resin component has a glass transition temperature higher than that of the secondary resin component and lower than that of the first main resin component, and a reaction peak temperature of each of the adhesive layers is lower than the glass transition temperature of the first main resin component and higher than the glass transition temperature of the second main resin component, and is a temperature at which a calorific value of the adhesive layer is maximum during temperature rise.

6 Claims, 3 Drawing Sheets

FOREIGN PATENT DOCUMENTS

| | | |
|---|---|---|
| JP | 9-312176 A | 12/1997 |
| JP | 2004-328000 A | 11/2004 |
| JP | 2006-032335 A | 2/2006 |
| JP | 2007-131649 A | 5/2007 |
| JP | 2007-150324 A | 6/2007 |

OTHER PUBLICATIONS

Ichiro Ogura, "Joshiki Yaburi No Saishin' El Epoxy Resin (State-Of-The-Arts Technologies of Hyper Epoxy Resins Beyond History)", DIC Technical Review, 2005, No. 11, pp. 21-28.

* cited by examiner

ADHESIVE FILM, CONNECTING METHOD, AND JOINED STRUCTURE

CROSS-REFERENCE TO RELATED APPLICATION

This is a continuation of Application No. PCT/JP2008/061521, filed on Jun. 25, 2008.

BACKGROUND OF THE INVENTION

1. Field of the Invention

The present invention relates to an adhesive film which is used for connecting an electrical part to a substrate, a connecting method thereof, and a joined structure.

2. Description of the Related Art

An anisotropic conductive adhesive has been conventionally used for connecting an electronic part or a wiring board to a substrate. The anisotropic conductive adhesive contains a binder and conductive particles dispersed in the binder.

When the anisotropic conductive adhesive is placed between the surface of the substrate where the terminals are disposed and the surface of the electronic part where the terminals are disposed, and heated and pressurized, the softened binder is pushed out from the space between the terminal of the substrate and the terminal of the electronic part, and the conductive particles are held between the terminal of the substrate and the terminal of the electronic part, to thereby electrically connect the substrate and the electronic part.

However, when the binder is pushed out, a part of the conductive particles is pushed out together with the binder, and the pushed conductive particles are moved into the space between the adjacent terminals of the substrate or the adjacent terminals of the electronic part, which may cause a short circuit due to the conductive particles present between the adjacent terminals.

Moreover, when the conductive particles are pushed out from the space between the terminal of the substrate and the terminal of the electronic part, the number of the conductive particles which can be held between the terminal of the substrate and the terminal of the electronic part is decreased, lowering the conduction reliability (see Japanese Patent Application Laid-Open (JP-A) Nos. 2006-32335 and 07-230840).

BRIEF SUMMARY OF THE INVENTION

The present invention aims at solving the problems in the art, and achieving the following object. An object of the present invention is to provide an adhesive film, a connecting method, and a joined structure, which are capable of connecting an electronic part to a substrate without causing a short circuit.

The means for solving the aforementioned problem are as follow:

<1> An adhesive film including: a first adhesive layer which contains a first main resin component and dispersed conductive particles; and a second adhesive layer which contains a second main resin component, and adheres to the first adhesive layer, each of the adhesive layers containing a secondary resin component, wherein when the first adhesive layer and the second adhesive layer are raised in temperature, the secondary resin component reacts, so that the first adhesive layer and the second adhesive layer are cured, wherein in the first adhesive layer the first main resin component has a glass transition temperature higher than that of the secondary resin component, wherein in the second adhesive layer the second main resin component has a glass transition temperature which is higher than that of the secondary resin component and lower than that of the first main resin component, and wherein a reaction peak temperature of each of the first adhesive layer and the second adhesive layer is lower than the glass transition temperature of the first main resin component and higher than the glass transition temperature of the second main resin component, the reaction peak temperature being a temperature at which a calorific value of the adhesive layer is maximum during temperature rise.

<2> The adhesive film according to <1>, wherein a thickness of the first adhesive layer is 0.5 times to 2.0 times of an average particle diameter of the conductive particles.

<3> The adhesive film according to any one of <1> to <2>, wherein the second main resin component has a glass transition temperature of 50° C. to 110° C.

<4> The adhesive film according to any one of <1> to <3>, wherein a difference in the reaction peak temperature between the first adhesive layer and the second adhesive layer is 10° C. or less.

<5> A connecting method including placing an electrode of a first substrate and an electrode of a second substrate so as to face to each other via the adhesive film according to any one of <1> to <4>, and heating and pressurizing the first substrate and the second substrate with the conductive particles being held between the electrode of the first substrate and the electrode of the second substrate, so as to connect the first substrate and the second substrate.

<6> A joined structure including: a first substrate containing an electrode; a second substrate containing an electrode; and an adhesive film, which are connected by the connecting method according to <5>.

According to the present invention, various problems in the art can be solved, the aforementioned object can be achieved, and an adhesive film, a connecting method, and a joined structure, which are capable of connecting an electronic part to a substrate without causing a short circuit, can be provided.

The adhesive film of the present invention is structured as described above, and the secondary resin component is a resin which is polymerized by heating (for example, a thermosetting resin).

When the first adhesive layer and the second adhesive layer are raised in temperature, the secondary resin component each contained in the first adhesive layer and the second adhesive layer reacts. Specifically, the reaction of the secondary resin component is, for example, in the presence of a curing agent or the like, the secondary resin component is polymerized alone or copolymerized by the reaction with other components. In both cases, the first adhesive layer and the second adhesive layer produce heat. The calorific value increases as temperature rises. But the temperature exceeds a certain point, and then the calorific value decreases.

In the present invention, the reaction peak temperature of the first adhesive layer containing dispersed conductive particles is defined as a temperature at which the calorific value thereof begins to decrease during temperature rise, and the reaction peak temperature of the second adhesive layer is defines as a temperature at which the calorific value thereof begins to decrease during temperature rise. The calorific value and the reaction peak temperature are measured, for example, by a differential scanning calorimetry (DSC).

As a raw material for the first adhesive layer, the first main resin component having a higher glass transition temperature than the reaction peak temperature of each of the first adhesive layer and the second adhesive layer is used, and the raw material is mixed with other raw materials (e.g., the secondary resin component and the additive) and a solvent, so as to produce a raw material liquid for the first adhesive layer. The raw material liquid is applied to a surface of the release film to form a coating layer. Then, the coating layer of the raw material liquid is dried to remove an excess solvent, whereby a first adhesive layer is formed.

As a raw material for the second adhesive layer, the second main resin component having a glass transition temperature which is lower than the glass transition temperature of the first main resin component and lower than the reaction peak temperature of each of the first adhesive layer and the second adhesive layer is used, and the raw material is mixed with other raw materials (e.g., the secondary resin component and the additive) and a solvent, so as to produce a raw material liquid for the second adhesive layer. The raw material liquid is applied to a surface of the release film to form a coating layer. Then, the coating layer of the raw material liquid is dried to remove an excess solvent, whereby a second adhesive layer is formed.

The first main resin component and the second main resin component are polymeric materials each having a higher glass transition temperature (Tg) than the normal temperature (30° C.) (30° C. or higher, more preferably 50° C. or higher), and chemically stable.

Therefore, the glass transition temperature of the first main resin component is higher than the reaction peak temperature of each of the first adhesive layer and the second adhesive layer, both before the first main resin component is mixed in the solvent as the raw material and in a state where it is contained in the first adhesive layer after mixing and drying.

On the other hand, the glass transition temperature of the second main resin component is lower than that of the first main resin component and lower than the reaction peak temperature of each of the first adhesive layer and the second adhesive layer, both before the second main resin component is mixed in the solvent as the raw material and in a state where it is contained in the second adhesive layer after mixing and drying.

When the first main resin component and the second main resin component have the same glass transition temperature, the first adhesive layer and the second adhesive layer are started to melt virtually simultaneously. However, in the present invention, since the glass transition temperature of the first main resin component is higher than the glass transition temperature of the second main resin component, the first adhesive layer and the second adhesive layer have different melt initiating temperatures. At the temperature, at which the second adhesive layer is melted, the first adhesive layer is not melted.

When the adhesive film is sandwiched between the terminals and heated and pressurized, the second adhesive layer is melted and pushed out from the portion between the terminals, but the first adhesive layer is not melted and present between the terminals. Thus, the conductive particles are not pushed out from the portion between the terminals and present in the first adhesive layer.

Since the conductive particles are not pushed out from the portion between the terminals facing to each other, and present in the first adhesive layer, the number of the conductive particles captured between the terminals facing to each other is increased. Moreover, since the conductive particles are not pushed out to the portion between terminals adjacent to each other, short circuit caused by the presence of the conductive particles between the adjacent terminals does not occur. Therefore, a joined structure in which the electronic part is connected to the substrate using the adhesive film of the present invention attains high conduction reliability.

Figure 1A:
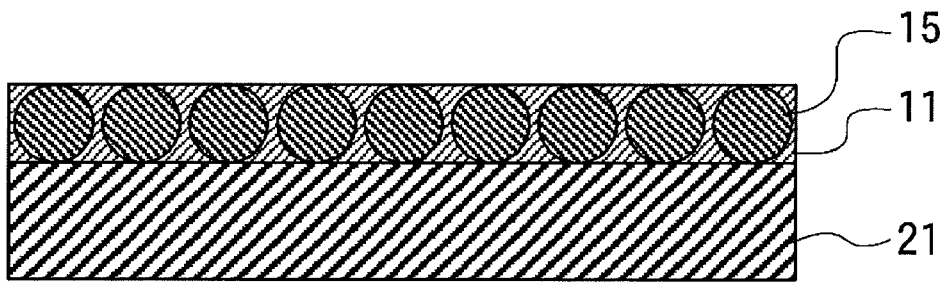
FIG. 1A is a cross-sectional view explaining a process of producing an adhesive film of the present invention (part 1).

DETAILED DESCRIPTION OF THE INVENTION (Adhesive Film)
The adhesive film of the present invention includes at least a first adhesive layer, and a second adhesive layer that is adhered to the first adhesive layer, and optionally further includes suitably selected other layers.
<First Adhesive Layer>
The first adhesive layer contains at least conductive particles, a secondary resin component, and a first main resin component, and optionally further contains suitably selected other components.
-Conductive Particles-
The conductive particles are suitably selected depending on the intended purpose without any restriction, as long as the conductive particles are dispersed in the first adhesive layer.

Specific examples of the conductive particles include metal particles mainly containing a metal such as nickel, copper and cobalt, etc., the aforementioned metal particles plated with gold, and organic fine particles which surfaces are coated with a conductive coating such as nickel plate, copper plate, gold plate and solder plate, etc.

A type of the conductive particles may be dispersed in the first adhesive layer, or two or more types of the conductive particles may be dispersed in the first adhesive layer. When a surface of a connecting terminal of an adherend (an electronic part or a substrate) is easily oxidized, conductive particles, to which each surface a projection made of nickel or the like is adhered, may be used.

To correspond to fine pitch of the connecting terminal, insulating coating particles which are obtained by coating a surface of each conductive particle with a resin melted by heat may be used.

The particle diameter (average particle diameter) of the conductive particles depends on the pitch and area of a connecting terminal, and according to the present invention, the average particle diameter is preferably 1 μm to 50 μm. When the average particle diameter of the conductive particles is less than 1 μm, the conductive particles tend to aggregate, which may cause occurrence of a short circuit.

When the average particle diameter of the conductive particles is more than 50 μm, it is not necessary to use an adhesive film, which is mainly used for fine-pitch connection.

-Secondary Resin Component-

The secondary resin component is suitably selected depending on the intended purpose without any restriction. Examples thereof include a liquid resin and a crystalline resin.

The secondary resin component is a resin, which has a lower glass transition temperature than the glass transition temperatures of a first main resin component and a second main resin component, which will be described hereinafter, and polymerizes at a certain curing temperature or higher, and imparts curability to the adhesive layer.

The liquid resin has a lower glass transition temperature than normal temperature (30° C.) and is liquid at the normal temperature (30° C.), but is polymerized by heating at a certain curing temperature which is higher than the normal temperature (30° C.). The polymerized resin is solid at the normal temperature (30° C.).

Once the crystalline resin, which is solid or crystal at the normal temperature (30° C.), is heated and melted at a certain melting temperature higher than the normal temperature (30° C.), it becomes a liquid state. Thereafter, even though the liquid crystalline resin is cooled down to the normal temperature (30° C.), it keeps a liquid state. When the crystalline resin, which has been melted, is heated at a certain curing-initiating temperature or higher, the crystalline resin is polymerized. The polymerized resin is solid at the normal temperature (30° C.).

Examples of the crystalline resin include epoxy resins, acrylate, methacrylate, silane coupling agents, melamine resins, and phenol resins.

The same type of the secondary resin components may be contained or different types of the secondary resin components may be contained in the first adhesive layer and the second adhesive layer, which will be described hereinafter. In order to increase the adhesion between the first adhesive layer and the second adhesive layer, the same type of the secondary resin components are preferably added therein.

-First Main Resin Component-

A first main resin component is suitably selected depending on the intended purpose without any restriction, as long as it has a higher glass transition temperature than that of the secondary resin component. Examples thereof include phenoxy resins, polyurethane resins, saturated polyesters, acrylic rubbers, NBR rubbers, polybutadiene rubbers, polystyrenes, polyethylenes, polyvinyl acetate and copolymers thereof. These resins are thermoplastic resins.

The first main resin component is a solid resin which is solid at the normal temperature (30° C.). That is, the glass transition temperature of the first main resin component is higher than the normal temperature (30° C.).

The first main resin component plays an important role as a film component in forming the first adhesive layer into a sheet-shape.

The first main resin component is a resin whose state changes into a solid or liquid at a glass transition temperature, and it is not limited to the thermoplastic resin as long as it has a higher glass transition temperature than the normal temperature (30° C.). For example, a thermosetting resin having a glass transition temperature which is lower than a polymerization initiating temperature and higher than the normal temperature (30° C.) can be used. Examples of the thermosetting resin include a polymer epoxy resin in which the epoxy group is bound to an end of the main skeleton, and epoxy acrylate in which a terminal epoxy group is acrylated. The thermosetting resin used as the first main resin component has a higher molecular mass than that of a thermosetting resin used as the secondary resin component.

-Other Components-

The aforementioned other components are suitably selected depending on the intended purpose without any restriction. Examples thereof include inorganic fillers and organic fillers.

<Second Adhesive Layer>

The second adhesive layer contains at least the secondary resin component and the second main resin component, and other components suitably selected depending on the intended purpose. The secondary resin component in the second adhesive layer is the same as described in the first adhesive layer.

-Second Main Resin Component-

The second main resin component is suitably selected depending on the intended purpose without any restriction, as long as it has a glass transition temperature higher than that of the secondary resin component and lower than that of the first main resin component. Examples thereof include phenoxy resins, polyurethane resins, saturated polyesters, acrylic rubbers, NBR rubbers, polybutadiene rubbers, polystyrenes, polyethylenes, polyvinyl acetate and copolymers thereof. These resins are thermoplastic resins.

The second main resin component is a solid resin which is solid at the normal temperature (30° C.). That is, the glass transition temperature of the second main resin component is higher than the normal temperature (30° C.).

The second main resin component plays an important role as a film component in forming the second adhesive layer into a sheet-shape.

The second main resin component is a resin whose state changes into a solid or liquid at a glass transition temperature, and it is not limited to the thermoplastic resin as long as it has a higher glass transition temperature than the normal temperature (30° C.). For example, a thermosetting resin having a glass transition temperature which is lower than a polymerization initiating temperature and higher than the normal temperature (30° C.) can be used. Examples of the thermosetting resin include a polymer epoxy resin in which the epoxy group is bound to an end of the main skeleton, and epoxy acrylate in which a terminal epoxy group is acrylated. The thermosetting resin used as the second main resin component has a higher molecular mass than that of a thermosetting resin used as the secondary resin component.

A type of the first main resin component and the second main resin component may be respectively contained in the first adhesive layer and the second adhesive layer, or two or more types of the first main resin components and the second main resin components may be respectively contained in the first adhesive layer and the second adhesive layer.

As the first main resin component and the second main resin component, the same or different types of resins may be used. In the case where the same types of resins are used as the first main resin component and the second main resin component, as the first main resin component, a resin having a higher molecular mass than that of the second main resin component is used, so that the glass transition temperature of the first main resin component is higher than the glass transition temperature of the second main resin component.

As the first main resin component, a resin having a higher glass transition temperature than the first reaction peak temperature, i.e. a reaction peak temperature of the first adhesive layer, and the second reaction peak temperature, i.e. a reaction peak temperature of the second adhesive layer, is used.

On the other hand, as the second main resin component, a resin having a glass transition temperature, which is lower than the glass transition temperature of the first main resin component and lower than the first reaction peak temperature and the second reaction peak temperature, is used.

The reaction peak temperature is the maximum exothermic peak temperature in the DSC curve obtained by differential scanning calorimetry (DSC).

It is preferred that the first reaction peak temperature and the second reaction peak temperature are respectively 60° C. to 140° C.

It is not preferred that the first reaction peak temperature and the second reaction peak temperature be lower than 60° C., because there is a possibility that the reactions of the first adhesive layer and the second adhesive layer start, when the adhesive film is temporarily fixed on an adherend such as a substrate or the like.

When the first reaction peak temperature and the second reaction peak temperature are higher than 140° C., in a final pressure bonding step of sandwiching the adhesive film between two adherends and of heating and pressurizing the resultant product, the curing of the first adhesive layer and the second adhesive layer takes longer than 20 sec. Thus, the connection cannot be achieved for a short time, adversely affecting mass productivity. On the other hand, in order for the connection to be achieved for a short time, i.e. less than 20 sec, the adhesive film and two adherends must be connected at a high temperature of 250° C. or higher, excessively damaging the adherends, which is not preferred.

When the difference between the first reaction peak temperature and the second reaction peak temperature is higher than 10° C., of the first adhesive layer and the second adhesive layer, one adhesive layer that has a lower reaction peak temperature is cured faster than the other adhesive layer is. Thus, the pressing speed in the final pressure bonding step is limited. In addition, the first and second adhesive layers differ in the time for completion of the connection. Therefore, such a combination of the adhesive layers is not suitable for the short-time connection, and not for practical use.

The first main resin component and the second main resin component each having a glass transition temperature of 30° C. or lower are not preferably used, since when the adhesive film is formed into a reel-shaped product and left at the normal temperature (30° C.) or higher, the adhesive easily outflows, causing blocking, namely the adhesive film cannot be wound off from the reel.

-Other Components-

The aforementioned other components are suitably selected depending on the intended purpose without any restriction. Examples thereof include conductive particles, inorganic fillers and organic fillers.

<Other Layers>

Other layers are suitably selected depending on the intended purpose without any restriction.

Here, an example of a process of producing the adhesive film of the present invention will be described with reference to the drawings.

The secondary resin component, the first main resin component, the conductive particles, an additive such as a coupling agent, a curing agent or the like, and a solvent are mixed so as to produce a first raw material liquid.

The secondary resin component and the second main resin component having a lower glass transition temperature than that of the first main resin component, an additive such as a coupling agent, a curing agent or the like, and a solvent are mixed so as to produce a second raw material liquid.

In order to accelerate polymerization reaction of the secondary resin components respectively contained in the first adhesive layer and the second adhesive layer, both the first raw material liquid and the second raw material liquid preferably contain the curing agents.

The curing agent is suitably selected depending on the intended purpose without any restriction, as long as it thermally cures the secondary resin components respectively contained in the first adhesive layer and the second adhesive layer. Examples thereof include amine curing agents such as polyamine, polyamide, imidazole, and microcapsulation thereof, cationic curing agents such as onium salts and sulfonium salts, radical initiators such as organic oxides, acid anhydrides, and thiol curing agents.

The curing agent alone may be added respectively in the first raw material liquid and the second raw material liquid, and the two or more types of the curing agents may be added respectively in the first raw material liquid and the second raw material liquid.

Moreover, it is preferred that the first main resin component, the second main resin component, the secondary resin component and the curing agent be suitably combined so as to adjust the difference between the first reaction peak temperature and the second reaction peak temperature to less than 10° C., for preparing the raw material liquids for the first adhesive layer and second adhesive layer.

Figure 1B:
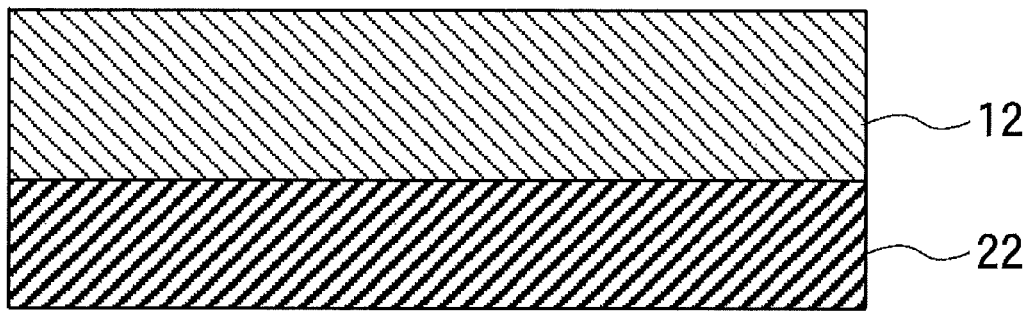
FIG. 1B is a cross-sectional view explaining the process of producing an adhesive film of the present invention (part 2).

In FIGS. 1A and 1B, on a surface of a release film 21 and on a surface of a release film 22, the first raw material liquid and the second raw material liquid are respectively applied so as to form coating layers, and then the coating layers are dried and excess solvents are removed, thereby respectively forming a first adhesive layer 11 and a second adhesive layer 12, in a form of a film.

As described above, since the first raw material liquid contains conductive particles 15, the conductive particles 15 are dispersed in the first adhesive layer 11 in FIG. 1A. In the second adhesive layer 12, the conductive particles 15 are not dispersed, and if the conductive particles 15 are dispersed therein, the particle density of the conductive particles 15 in the second adhesive layer 12 is smaller than that of the conductive particles 15 in the first adhesive layer 11.

Figure 1C:
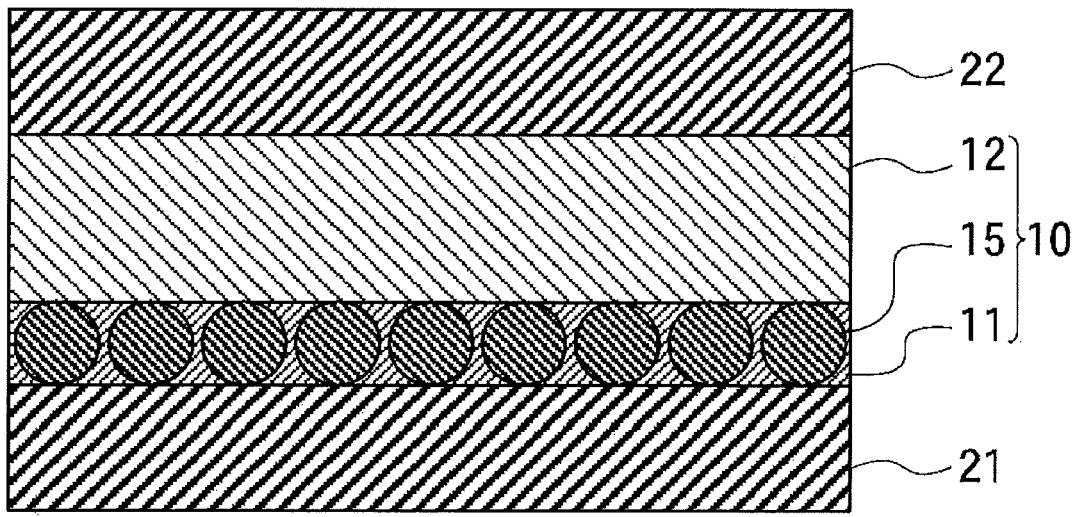
FIG. 1C is a cross-sectional view explaining the process of producing an adhesive film of the present invention (part 3).

The first adhesive layer 11 and the second adhesive layer 12 are bonded in such a manner that surfaces of the first adhesive layer 11 and the second adhesive layer 12, on which the release films are not formed, are adhered to each other, and pressed by a pressure roller or the like, so as to obtain an adhesive film 10 (FIG. 1C).

The method for producing the adhesive film 10 is not limited to the case of bonding the first adhesive layer 11 and the second adhesive layer 12. Alternatively, the adhesive film 10 may be formed by applying the second raw material liquid to a surface of the first adhesive layer 11 in a form of a film, and then drying to form the second adhesive layer 12, or by applying the first raw material liquid to a surface of the second adhesive layer 12 in a form of a film, and then drying to form the first adhesive layer 11.

Figure 4:
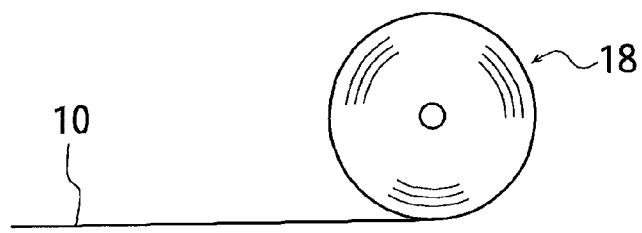
FIG. 4 is a side view showing the state of the adhesive film rolled up in a roll.

The adhesive film 10, in which the release film 21 and/or the release film 22 are/is bonded to both or either one of the surfaces of the first adhesive layer 11 and/or the second adhesive layer 12, is rolled up, so that a roll 18 of the adhesive film 10 is obtained (FIG. 4).

When the first adhesive layer 11 and the second adhesive layer 12 are softened, the softened portion outflows and then bonds the adhesive films 10 next to each other in the roll-shape, causing blocking. Thus, the adhesive film 10 cannot be wound off from the roll 18.

When the first main resin component and the second main resin component each having a glass transition temperature of 30° C. or higher are used, the first adhesive layer 11 and the second adhesive layer 12 are not softened or melted at the normal temperature (30° C.). Thus, even when the roll 18 is stored for a long period of time at the normal temperature (30° C.), blocking does not occur, and the roll 18 can have a longer shelf time.

Next, an example of a process of connecting the substrate to the electronic part using the adhesive film of the present invention will be described.

The adherend connected using the adhesive film 10 is not particularly restricted. For example, as an electronic part 4 (second substrate), a semiconductor chip, a resistance element, a chip on film (COF) device, a tape automated bonding (TAB) device, or the like may be used.

A substrate 3 (first substrate) is not restricted to a glass substrate. Examples thereof include a rigid substrate and flexible wiring board.

Figure 2A:
FIG. 2A is a cross-sectional view explaining a process of connecting an electronic part to a substrate (part 1).

In FIG. 2A, as an adherend the substrate 3 such as an LCD panel or the like has a substrate body 31 such as a glass plate, and a plurality of first terminals (electrodes) 35 disposed with certain intervals therebetween on the surface of the substrate body 31.

Figure 2B:
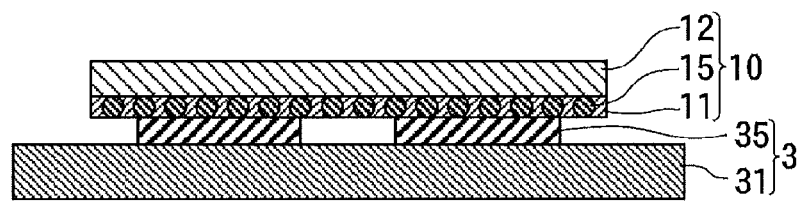
FIG. 2B is a cross-sectional view explaining the process of connecting an electronic part to a substrate (part 2).

The release film 21 is released from the first adhesive layer 11 so as to expose the surface of the first adhesive layer 11. Then, the surface of the adhesive film 10, in which the first adhesive layer 11 is exposed, is adhered to a surface of the substrate 3 in which first terminals 35 are exposed, and then temporarily bonded (FIG. 2B).

In the case where the release film 22 is adhered to the second adhesive layer 12, the release film 22 is released before or after temporal bonding, so as to expose the surface of the second adhesive layer 12.

Figure 2C:
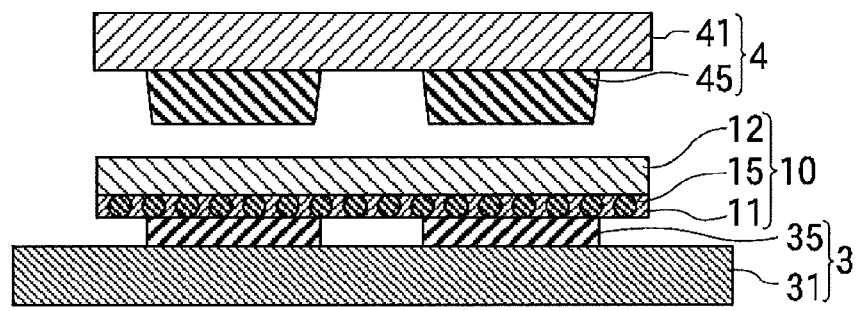
FIG. 2C is a cross-sectional view explaining the process of connecting an electronic part to a substrate (part 3).

In FIG. 2C, the electronic part 4 connected to the substrate 3 has the smaller planar shape than that of the substrate 3, and the electronic part 4 has a part body 41 and a plurality of second terminals (electrodes) 45 disposed on one surface of the part body 41.

A distance between the center positions (i.e., a pitch) of each first terminals 35 and a distance between the center positions of second terminals 45 (i.e., a space between the bumps) are made equal. The electronic part 4 is positioned so that each of the second terminals 45 are located above each of the first terminals 35, and as shown in FIG. 2D, the surface of the electronic part 4 where the second terminals 45 are disposed is adhered to the surface of the second adhesive layer 12 and then temporarily fixed.

The reaction peak temperature of each of the first adhesive layer 11 and the second adhesive layer 12 is lower than the glass transition temperature of the first main resin component and higher than the glass transition temperature of the second main resin component.

Figure 2D:
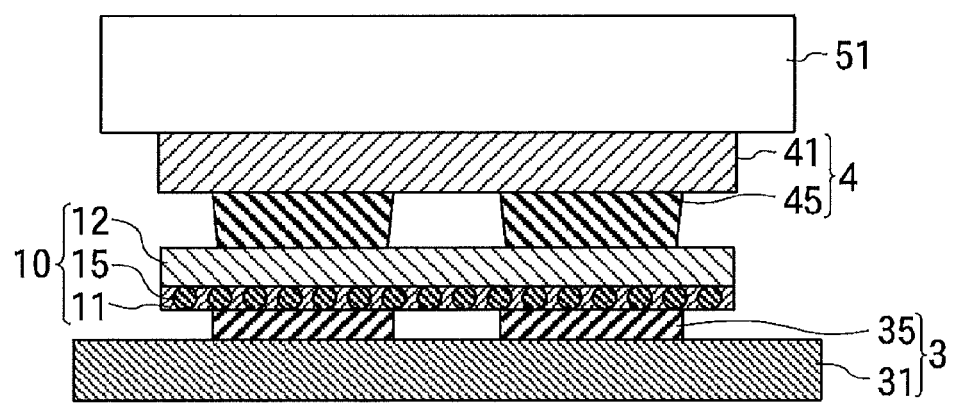
FIG. 2D is a cross-sectional view explaining the process of connecting an electronic part to a substrate (part 4).

The temperature of a heating unit 51 is raised higher than the glass transition temperature of the first main resin component, and then the heating unit 51 is pressed against either one or both of the substrate 3 and the electronic part 4, which have been temporarily fixed (FIG. 2D).

The first adhesive layer 11 and the second adhesive layer 12 are gradually raised in temperature by heat conduction, and firstly when the temperature reaches the glass transition temperature of the second main resin component, the second adhesive layer 12 is melted, and an edge of the second terminal 45 pushes the melted second adhesive layer 12 away by means of pressing force.

Even though the second adhesive layer 12 is pushed out to the portion between the adjacent second terminals 45, no short circuit is occurred between the second terminals 45. This is because the second adhesive layer 12 has no conductive particles dispersed therein.

Since the glass transition temperature of the first main resin component is higher than the glass transition temperature of the second main resin component, the first adhesive layer 11 is not melted and the first adhesive layer 11 is not pushed out from the portion between the first terminals 35 and the second terminals 45. Therefore, the conductive particles 15 are not pushed out from the portion between the first terminals 35 and the second terminals 45 and present in the first adhesive layer 11.

Figure 3:
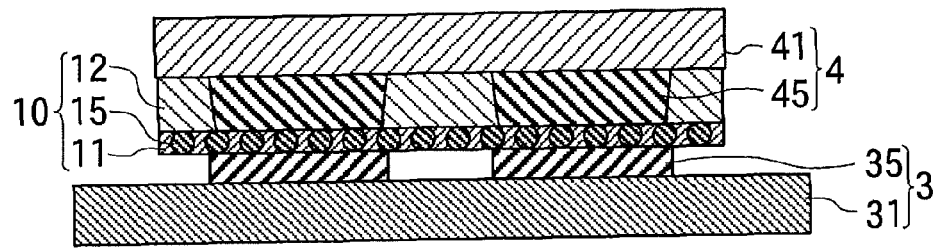
FIG. 3 is a cross-sectional view showing a state of the electronic part connected to the substrate.

Before the temperatures of the first adhesive layer 11 and the second adhesive layer 12 respectively reach the reaction peak temperatures, the edges of the second terminals 45 push the second adhesive layer 12 away, and the edges of the second terminals 45 are in contact with the first adhesive layer 11 and further pressed thereto (FIG. 3).

The first adhesive layer 11 is neither melted nor cured, and has no flowability, but can be elastically deformed in the temperature range from the glass transition temperature or higher of the second main resin component in the second adhesive layer to the reaction peak temperature or lower thereof.

The thickness of the first adhesive layer 11 is thin, specifically 0.5 times to 2.0 times of the average particle diameter of the conductive particles 15. When the heat-pressurization is further continued while the second terminal 45 is in contact with the first adhesive layer 11, the first adhesive layer 11 is elastically deformed, and then the conductive particles 15 are held between the first terminals 35 and the second terminals 45 so that the first terminals 35 and the second terminals 45 are electrically connected.

At least the first adhesive layer 11 is located between the conductive particles 15, and the edges of the first terminals 35 and the second terminals 45 are in contact not only with the conductive particles 15, but also with the first adhesive layer 11.

The heat-pressurization is continued so as to hold the conductive particles 15 between the first terminals 35 and the second terminals 45, and then the first adhesive layer 11 and the second adhesive layer 12 are respectively raised in temperature to the reaction peak temperatures. As a result, the polymerization reaction of the secondary resin components contained in the first adhesive layer 11 and the second adhesive layer 12 proceeds, the first adhesive layer 11 and the second adhesive layer 12 are cured, and then the edges of the first terminals 35 and the second terminals 45 are fixed by the cured first adhesive layer 11.

Meanwhile, the second adhesive layer 12, which is pushed out to the portion between the second terminals 45 by pressing force, is cured, while it adheres to the perimeter of each second terminal 45 and to the part body 41 which is exposed in a portion between the second terminals 45 adjacent to each other.

The first adhesive layer 11 is not pushed out from the portion between the first terminals 35 and the second terminals 45 upon the heat-pressurization, but the first adhesive layer is deformed and solidified while it adheres to the substrate body 31 between the first terminals 35 adjacent to each other. Therefore, not only the edges of the first terminals 35 and the second terminals 45, but also the peripheries of the first terminals 35 and the second terminals 45 are fixed by the cured first adhesive layer 11 and second adhesive layer 12, to thereby physically connect the electronic part 4 with the substrate 3.

Once the first adhesive layer 11 is cured, it is not melted even though the temperature thereof reaches the glass transition temperature of the first main resin component. Namely, since the first adhesive layer 11 is not melted before and after it is cured, and the conductive particles 15 are not pushed out from the first adhesive layer 11 disposed over the first terminals 35, high density of the conductive particles 15 between the first terminals 35 and the second terminals 45 are maintained, and the density of the conductive particles 15 between the adjacent first terminals 35 does not become high. Therefore, the connection between the electronic part 4 and the substrate 3 via the adhesive film 10 has high connection reliability.

In the case where a depth of a concave portion formed between the adjacent terminals is defined as a height of each terminal, the height of each first terminal 35 from the surface of the substrate body 31, in which the first terminal 35 adheres to the first adhesive layer 11 is lower than the height of each second terminal 45 from the surface of the part body 41, in which the second terminal 45 adheres to the second adhesive layer 12. After the temporal fixing or final pressure bonding, the first adhesive layer 11 may be brought into contact with the bottom surface of the concave portion between the adjacent first terminals 35, so that the contact area between the first adhesive layer 11 and the adherend becomes larger, to thereby increase the physical strength of the joined structure.

EXAMPLES

Hereinafter, the present invention is specifically explained with reference to examples and comparative examples thereof, but the examples shall not be construed as to limit the scope of the present invention.

Main resin components were respectively dissolved in a mixed solvent containing toluene and ethyl acetate in the ratio of 1:1 so as to obtain solutions each containing 30% by mass of a solid content (a main resin component).

A secondary resin component, conductive particles and a coupling agent were mixed in each solution according to each compounding ratio (mass ratio) shown in Table 1, to thereby produce four types of first raw material liquids and four types of second raw material liquids.

The first and second raw material liquids were respectively applied to a release film for a first adhesive layer and a release film for a second adhesive layer, and dried at 60° C. for 10 min, to produce first adhesive layers A1 to A4 and second adhesive layers N1 to N4.

The compounding ratios of the solid contents used in the first adhesive layers A1 to A4 and the second adhesive layers N1 to N4 are shown in Table 1.

The curing agent (the product name "HX3941HP", manufactured by Asahi Kasei Chemicals Corporation) is a microcapsule amine-based epoxy curing agent, which is a microcapsulated amine-based curing agent. The secondary resin component (the product name "EP828" manufactured by Japan Epoxy Resins Co., Ltd.) is a liquid bisphenol A epoxy resin, which is a liquid thermosetting resin at a normal temperature (30° C.).

The main resin components are as follows: the product name "YP70" is a phenoxy resin having a glass transition temperature (Tg point) of 84° C., and a molecular mass of 55,000, manufactured by Tohto Kasei Co., Ltd.; the product name "YDF2001" is a bisphenol F type epoxy solid resin having a glass transition temperature (Tg point) of 54° C., manufactured by Tohto Kasei Co., Ltd.; the product name "FX293" is a phenoxy resin having a glass transition temperature (Tg point) of 163° C., and a molecular mass of 45,000, manufactured by Tohto Kasei Co., Ltd.; the product name "EP4250" is a phenoxy resin having a glass transition temperature (Tg point) of 108° C., and a molecular mass of 60,000, manufactured by Japan Epoxy Resins Co., Ltd.; and the product name "SG708-6T" is an acrylic rubber having a glass transition temperature (Tg point) of −8° C., a molecular mass of 500,000, and a solid content of 15% (toluene/ethyl acetate=1/1), manufactured by Nagase ChemteX Corporation.

The product name "KBE403" is epoxy silane manufactured by Shin-Etsu Chemical Co., Ltd., and the product name "AUL704" is Ni/Au plated resin particles (average particle diameter of 4 μm) manufactured by SEKISUI CHEMICAL CO., LTD.

By the use of DSC Q100 manufactured by TA Instruments, the differential scanning calorimetry (DSC) of each first adhesive layer A1 to A4 and second adhesive layer N1 to N4 was performed under the conditions of temperature rise rate of 10° C./min respectively in the first adhesive layer 11 and the second adhesive layer 12, to thereby obtain a reaction peak temperature. The obtained DSC curve of the first adhesive layer A4 and the DSC curves of the main resin components (trade names "YP70" and "FX293") are shown in FIG. 5.

Figure 5:
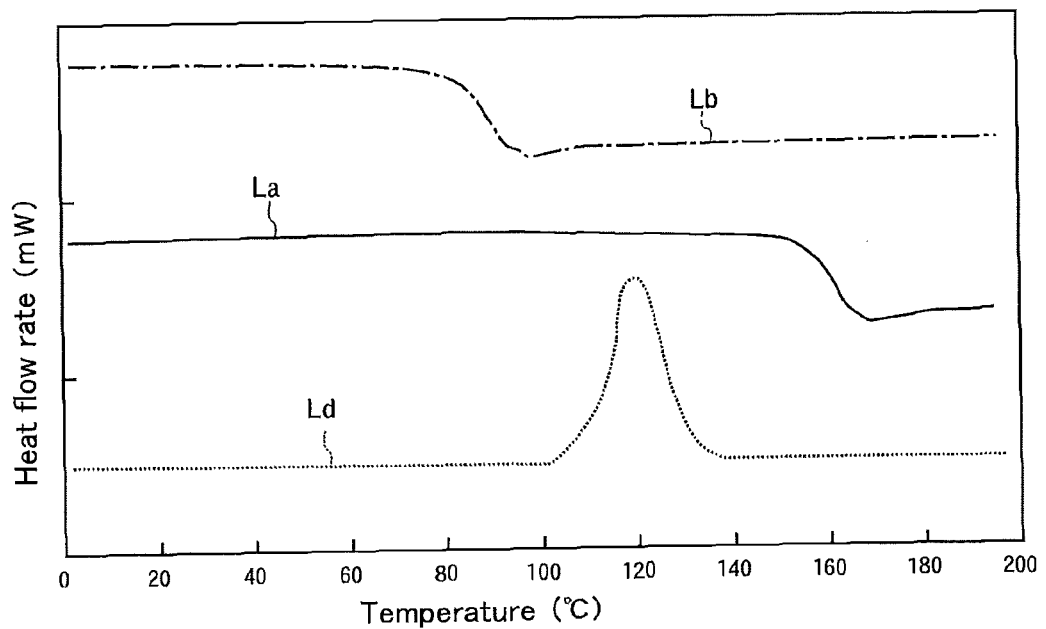
FIG. 5 is a graph showing DSC curves of a first main resin component, second main resin component, and first adhesive layer.

In FIG. 5, the vertical axis represents heat flow rate and the horizontal axis represents temperature, and the DSC curves of the first adhesive layer A4, trade name "FX293" and trade name "YP70" are respectively represented by Ld, La, and Lb.

TABLE 1

Compositions of the first and second adhesive layers

| | Trade name | Tg point (° C.) | First adhesive layer | | | | Second adhesive layer | | | |
|---|---|---|---|---|---|---|---|---|---|---|
| | | | A1 | A2 | A3 | A4 | N1 | N2 | N3 | N4 |
| Curing agent | HX3941HP | — | 39 | 50 | 50 | 50 | 9 | 50 | 50 | 50 |
| Secondary resin component | EP828 | — | 0 | 9 | 9 | 9 | 9 | 9 | 9 | 9 |
| Main resin component | SG708-6T | −8 | 60 | 0 | 0 | 0 | 90 | 0 | 0 | 0 |
| | YDF2001 | 54 | 0 | 0 | 0 | 0 | 0 | 40 | 0 | 0 |
| | YP70 | 84 | 0 | 40 | 0 | 0 | 0 | 0 | 40 | 0 |
| | EP4250 | 108 | 0 | 0 | 40 | 0 | 0 | 0 | 0 | 40 |
| | FX293 | 163 | 0 | 0 | 0 | 40 | 0 | 0 | 0 | 0 |
| Coupling agent | KBE403 | — | 1 | 1 | 1 | 1 | 1 | 0 | 1 | 1 |
| Conductive particles | AUL704 | — | Present | Present | Present | Present | Absent | Absent | Absent | Absent |
| Reaction peak temperature | | | 121° C. | | | | 121° C. | | | |

In Table 1, "—" in the column of the glass transition temperature (Tg point) means a liquid state at room temperature.

In FIG. 5, the heat flow rate of the first adhesive layer A4 is maximum at 121° C., namely, the calorific value resulting from the polymerization reaction of the secondary resin component is maximum. This shows that the reaction peak temperature of the first adhesive layer A4 is 121° C.

Meanwhile, the heat flow rates of the DSC curve La of "FX293" and the DSC curve Lb of "YP70" respectively decrease at 163° C. and 84° C. because of the endotherm due to melting, which shows that the glass transition temperatures of "FX293" and "YP70" are respectively 163° C. and 84° C.

Next, the first adhesive layers A1 to A4 and the second adhesive layers N1 to N4 were bonded in the combination shown in Table 2 using a rubber roller, so as to produce adhesive films each having a thickness of 20 μm, in Examples X4, Y1 to Y3 and Comparative Examples X1 to X3.

TABLE 2

Combination of the first adhesive layer and second adhesive layer

| | | Comparative Example | | | Example | | | |
|---|---|---|---|---|---|---|---|---|
| Adhesive film | | X1 | X2 | X3 | X4 | Y1 | Y2 | Y3 |
| Conductive adhesive layer | First adhesive layer | A1 | A2 | A3 | A4 | A4 | A4 | A4 |
| | Thickness (μm) | 4 | 4 | 4 | 10 | 4 | 4 | 4 |
| Insulating adhesive layer | Second adhesive layer | N1 | N3 | N3 | N3 | N2 | N3 | N4 |
| | Thickness (μm) | 16 | 16 | 16 | 10 | 16 | 16 | 16 |
| Particle density (number/mm²) | | 30,000 | 30,000 | 30,000 | 30,000 | 30,000 | 30,000 | 30,000 |

The adhesive films of Examples X4, Y1 to Y3 and Comparative Examples X1 to X3 were observed by an optical microscope to measure a density of the conductive particles per 1 mm². As shown in Table 2, the adhesive films of Examples X4, Y1 to Y3 and Comparative Examples X1 to X3 have the same density of the conductive particles.

Next, by the use of the adhesive films of Examples X4, Y1 to Y3 and Comparative Examples X1 to X3, an electronic part (IC chip) and a substrate were connected in the following mounting step.

<Mounting Step>

An IC chip for evaluation (the material: silicon, plane area: 1.8 mm×20 mm, thickness: 0.5 mm, gold bump, bump height: 15 μm, bump area: 20 μm×85 μm, space between the bumps: 10 μm, a distance between bump centers, i.e. pitch: 30 μm), and an ITO patterned glass for evaluation (substrate body: product name "1737F" manufactured by Corning Incorporated, glass size: 50 mm×30 mm×0.7 mm, ITO pad (terminal) size: 20 μm×85 μm, a distance between pad centers, i.e. pitch: 30 μm) were prepared.

Each of the adhesive films of Examples X4, Y1 to Y3 and Comparative Examples X1 to X3 cut into a rectangle shape of 2.0 mm in length×25 mm in width was placed on the ITO patterned glass, and pressed by a pressure bonding device used for temporarily bonding (tool size: 2.0 mm×50 mm) with a buffering material (TEFLON having a thickness of 70 μm) being between the adhesive film and the device under the conditions of the device temperature at 80° C. and the device pressing force at 1 MPa, for 2 seconds to temporarily bond to the ITO patterned glass.

The release film for the first adhesive layer and the release film for the second adhesive layer were released from each of the adhesive films, and then IC chips were aligned on each adhesive film and temporarily fixed on the glass substrate (temporary fixation), and then heated and pressurized by means of a pressure bonding device used for final bonding (tool size: 30 mm×50 mm) with a buffering material (TEFLON having a thickness of 50 μm) being between the IC chips and the device under the conditions of the device temperature at 190° C. and the device pressing force at 3 MPa for 10 seconds, to thereby obtain seven types of joined structures (final pressure bonding).

<Capturing Efficiency>

In the mounting step, the number of the conductive particles present under one of the bumps of the IC chips after the temporary fixation, and the number of the conductive particles held between one of the bumps of the IC chips and one of the ITO pads of the ITO patterned glass (captured particle number) after the final pressure bonding were measured.

The measurement was performed on 100 bumps. The maximum value, minimum value, and average value of the captured particle number, and the capturing efficiency (unit: %) are shown in Table 3 below.

TABLE 3

| | | Capturing efficiency | | | | | | |
|---|---|---|---|---|---|---|---|---|
| | | Comparative Example | | | Example | | | |
| | | X1 | X2 | X3 | X4 | Y1 | Y2 | Y3 |
| Captured particle number per bump (number) | Max. | 24 | 23 | 27 | 33 | 45 | 44 | 40 |
| | Min. | 4 | 3 | 5 | 10 | 26 | 26 | 22 |
| | Ave. | 12 | 10 | 14 | 22 | 36 | 36 | 32 |
| Capturing efficiency (%) | | 23.5 | 19.6 | 27.5 | 43.1 | 70.6 | 70.6 | 62.8 |
| Conductive resistance (Ω) | Max. | 0.67 | 0.73 | 0.62 | 0.70 | 0.63 | 0.62 | 0.62 |
| | Min. | 0.42 | 0.42 | 0.42 | 0.44 | 0.41 | 0.41 | 0.41 |
| | Ave. | 0.53 | 0.64 | 0.52 | 0.67 | 0.51 | 0.51 | 0.51 |

(a connected area = 1,700 μm², a measuring number N = 100)

The capturing efficiency is a value which shows the number of the particles captured after the final pressure bonding with respect to the number of the particles present under a bump of the IC chip after the temporary fixation of the IC chip, based on a percentage, and can be obtained by the following Formula 1.

Capturing efficiency (%)=(Captured particle number after final pressure bonding)/(Number of particles present under a bump after temporary fixation of IC chip)×100    Formula 1

The capturing efficiency of each of Examples X4, Y1 to Y3 is high (43% to 71%). Of these, the capturing efficiency of each of Examples Y1 to Y3 is 60% or more, and Examples Y1 to Y3 are more preferred.

<Conductive Resistance>

The conductive resistance between one of the bumps and one of the terminals which faced the bump was measured after the final pressure bonding. The measurement was performed on 100 positions. The minimum value, maximum value, and average value of the conductive resistance are shown in Table 3 above.

As is clear from Table 3, Examples Y1 to Y3 have large number of the particles captured, and have a tendency of low conductive resistance, compared to Comparative Examples X1 to X3. It is confirmed that in the case where the adhesive film of the present invention is used for the connection of the electronic part to the substrate, the connection reliability is increased.

<Short Circuit Occurring Rate>

IC chips were connected to an ITO patterned glass so as to produce a joined structure in the same conditions as in the aforementioned mounting step, except that bumps of the IC chips and the wiring of the ITO patterned glass (ITO pad) were misaligned so as to be 7 mm apart from the predetermined position in the horizontal direction.

A voltage of 30V was applied between the ITO pads adjacent to the joined structure, and the insulation resistance was measured. The insulation resistance of $1.0 \times 10^{-6}$ Ω or less was regarded as an occurrence of a short circuit, and the number of the short circuit occurred was counted. Moreover, after leaving the joined structure in the conductive state in a high temperature and high humidity environment, specifically at the temperature of 85° C. and humidity of 85% for 500 hours, the number of the short circuit occurred was counted at 400 positions, and a short circuit occurring rate was obtained. The results are shown in Table 4.

TABLE 4

Short circuit occurring rate

| | | Comparative Example | | | Example | | | |
|---|---|---|---|---|---|---|---|---|
| | | X1 | X2 | X3 | X4 | Y1 | Y2 | Y3 |
| Short circuit occurring rate (%) | Initial | 1.00 | 1.00 | 1.00 | 0.25 | 0.00 | 0.00 | 0.25 |
| | 85° C./85%/500 hr | 2.00 | 2.00 | 2.00 | 0.50 | 0.25 | 0.25 | 0.25 |

(a space between adjacent terminals = 7 μm, a measuring number N = 400)

As is clear from Table 4, it is found that Examples X4, Y1 to Y3 have low short circuit occurring rates at the initial and after left in the high temperature and high humidity environment, compared to Comparative Examples X1 to X3.

<Blocking>

Each of the adhesive films of Examples X4, Y1 to Y3 and Comparative Examples X1 to X3 was cut out in a size of 1.5 mm in width and 100 m in length, rolled up in a reel, and then occurrence of blocking was confirmed. Meanwhile, the adhesive film, in which the release film was bonded to one surface, was rolled up in a reel.

The blocking was confirmed by the following method. At first, a 30 g weight was suspended from an end portion of the rolled conductive adhesive film, and left in a 30° C. atmosphere for 2 hours, which assumed an atmosphere inside the pressure bonding device. Thereafter, the conductive adhesive film was wound off at normal temperature to confirm whether or not a phenomenon that the conductive adhesive film could not be wound off (blocking) occurred.

"A" means that the conductive adhesive film which could be normally wound off, and "B" means that parts of the first adhesive layer and the second adhesive layer outflowed from the adhesive film, the outflowing portions were adhered to the adhesive film, and thus the adhesive film which could not be normally wound off. The results are shown in Table 5.

TABLE 5

Blocking

| | Comparative Example | | | Example | | | |
|---|---|---|---|---|---|---|---|
| | X1 | X2 | X3 | X4 | Y1 | Y2 | Y3 |
| Blocking | B | A | A | A | A | A | A |

As can be seen from Table 5, the blocking occurs in Comparative Example X1, in which the first main resin component and the second main resin component each having a glass transition temperature of less than 30° C. are used, but no blocking occurs in Examples X4, and Y1 to Y3.

In Examples X4, and Y1 to Y3, the glass transition temperature of the second main resin component is 50° C. to 110° C., and the glass transition temperature of the first main resin component is higher than 110° C., namely, it is higher than the glass transition temperature of the second main resin component.

Therefore, in the case where the glass transition temperature of the second main resin component is 50° C. to 110° C., and the glass transition temperature of the first main resin component is higher than the glass transition temperature of the second main resin component, when actually used, the rolled adhesive film involves less trouble upon being wound off.

What is claimed is:

1. An adhesive film, comprising:
a first adhesive layer which contains a first main resin component and dispersed conductive particles; and
a second adhesive layer which contains a second main resin component, and adheres to the first adhesive layer,
each of the adhesive layers containing a secondary resin component,
wherein when the first adhesive layer and the second adhesive layer are raised in temperature, the secondary resin component reacts, so that the first adhesive layer and the second adhesive layer are cured,
wherein in the first adhesive layer the first main resin component has a glass transition temperature higher than that of the secondary resin component,
wherein in the second adhesive layer the second main resin component has a glass transition temperature which is higher than that of the secondary resin component and lower than that of the first main resin component, and
wherein a reaction peak temperature of each of the first adhesive layer and the second adhesive layer is lower than the glass transition temperature of the first main resin component and higher than the glass transition temperature of the second main resin component, the reaction peak temperature being a temperature at which a calorific value of the adhesive layer is maximum during temperature rise.

2. The adhesive film according to claim 1, wherein a thickness of the first adhesive layer is 0.5 times to 2.0 times of an average particle diameter of the conductive particles.

3. The adhesive film according to claim 1, wherein the second main resin component has a glass transition temperature of 50° C. to 110° C.

4. The adhesive film according to claim 1, wherein a difference in the reaction peak temperature between the first adhesive layer and the second adhesive layer is 10° C. or less.

5. A connecting method, comprising:
placing an electrode of a first substrate and an electrode of a second substrate so as to face to each other via an adhesive film which comprises a first adhesive layer containing a first main resin component and dispersed conductive particles, and a second adhesive layer containing a second main resin component and adhering to the first adhesive layer, each of the adhesive layers containing a secondary resin component, and
heating and pressurizing the first substrate and the second substrate with the conductive particles being held between the electrode of the first substrate and the electrode of the second substrate, so as to connect the first substrate and the second substrate,
wherein when the first adhesive layer and the second adhesive layer are raised in temperature, the secondary resin component reacts, so that the first adhesive layer and the second adhesive layer are cured,
wherein in the first adhesive layer the first main resin component has a glass transition temperature higher than that of the secondary resin component,
wherein in the second adhesive layer the second main resin component has a glass transition temperature which is higher than that of the secondary resin component and lower than that of the first main resin component, and
wherein a reaction peak temperature of each of the first adhesive layer and the second adhesive layer is lower than the glass transition temperature of the first main resin component and higher than the glass transition temperature of the second main resin component, the reaction peak temperature being a temperature at which a calorific value of the adhesive layer is maximum during temperature rise.

6. A joined structure comprising:
a first substrate comprising an electrode;
a second substrate comprising an electrode; and
an adhesive film,
wherein the first substrate and the second substrate are connected by a connecting method, which comprises:
placing the electrode of the first substrate and the electrode of the second substrate so as to face to each other via the adhesive film which comprises a first adhesive layer containing a first main resin component and dispersed conductive particles, and a second adhesive layer containing a second main resin component, and adhering to the first adhesive layer, each of the adhesive layers containing a secondary resin component, and
heating and pressurizing the first substrate and the second substrate with the conductive particles being held between the electrode of the first substrate and the electrode of the second substrate, so as to connect the first substrate and the second substrate,
wherein when the first adhesive layer and the second adhesive layer are raised in temperature, the secondary resin component reacts, so that the first adhesive layer and the second adhesive layer are cured,
wherein in the first adhesive layer the first main resin component has a glass transition temperature higher than that of the secondary resin component,
wherein in the second adhesive layer the second main resin component has a glass transition temperature which is higher than that of the secondary resin component and lower than that of the first main resin component, and
wherein a reaction peak temperature of each of the first adhesive layer and the second adhesive layer is lower than the glass transition temperature of the first main resin component and higher than the glass transition temperature of the second main resin component, the reaction peak temperature being a temperature at which a calorific value of the adhesive layer is maximum during temperature rise.

* * * * *